US006490169B1

(12) United States Patent
Watanabe

(10) Patent No.: US 6,490,169 B1
(45) Date of Patent: Dec. 3, 2002

(54) CONDUCTIVE CIRCUIT STRUCTURE HAVING AN ELECTRICALLY CONDUCTIVE SURFACE FIXED BY COLLAR WALLS

(75) Inventor: Hiroshi Watanabe, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/717,402

(22) Filed: Nov. 22, 2000

(30) Foreign Application Priority Data

Dec. 15, 1999 (JP) .......................................... 11-355511

(51) Int. Cl.[7] .......................... H05K 1/14; H05K 1/02; H01R 12/22; H02G 5/06
(52) U.S. Cl. ....................... 361/784; 361/785; 361/750; 361/788; 361/803; 174/250; 174/72 B; 439/59; 439/62
(58) Field of Search ................................. 361/637, 638, 361/639, 648, 675, 611, 775, 788; 439/59, 62; 174/68.2, 68.3, 71 B, 72 B, 72 C, 98, 99 B, 110 SR, 121 SR, 149 B, 250, 251, 254, 258, 261, 262

(56) References Cited

U.S. PATENT DOCUMENTS

| | | | | |
|---|---|---|---|---|
| 3,293,353 A | * | 12/1966 | Hendriks et al. | 174/36 |
| 3,305,622 A | * | 2/1967 | Bergsman et al. | 174/36 |
| 3,622,687 A | * | 11/1971 | Doughty | 174/68.3 |
| 5,469,615 A | * | 11/1995 | Yamazaki | 29/846 |
| 5,677,515 A | * | 10/1997 | Selk et al. | 174/255 |
| 5,796,050 A | * | 8/1998 | Campbell | 174/255 |
| 6,100,473 A | * | 8/2000 | Wagener | 174/99 |

FOREIGN PATENT DOCUMENTS

| | | |
|---|---|---|
| JP | 10-249882 | 9/1998 |
| JP | 11-7833 | 1/1999 |
| JP | 11-77736 | 3/1999 |
| JP | 007833 | * 12/1999 |

* cited by examiner

Primary Examiner—David Martin
Assistant Examiner—Dameon E. Levi
(74) Attorney, Agent, or Firm—Morgan, Lewis & Bockius LLP

(57) ABSTRACT

An electrically conductive circuit conductor 2 is disposed on an insulating resin substrate 1, an electrically conductive surface 3 of the circuit conductor is exposed from the resin substrate continuously in a longitudinal direction, and both side portions 4 of the conductive surface are covered and fixed by collar walls 5 of the resin substrate. A bus bar or an electrically conductive resin material is used as the circuit conductor 2. The bus bar 2 is insert-molded onto the resin substrate. The electrically conductive resin material is poured and solidified in a groove portion in the resin substrate. A contact terminal on a mating circuit side or electrical component side is brought into contact with the conductive surface of the circuit conductor 2. A second circuit board is laminated on the resin substrate, and an insertion hole for allowing the conductive surface of the circuit conductor 2 to be exposed is provided in the second circuit board, and the contact terminal is inserted in the insertion hole. Other contact terminals on the mating circuit side or electrical component side are brought into contact with circuits of the second circuit board.

24 Claims, 5 Drawing Sheets

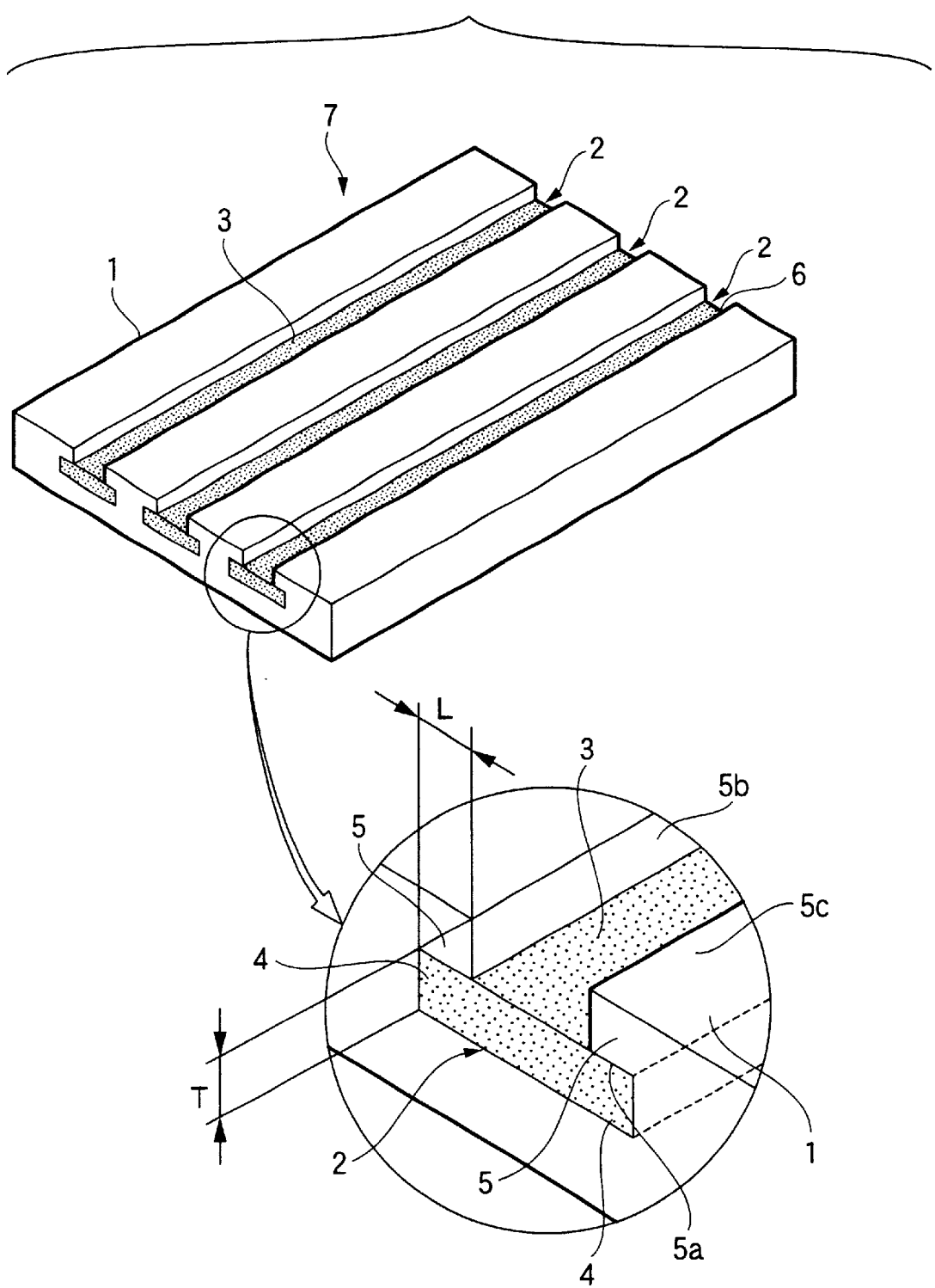

PRIOR ART

CONDUCTIVE CIRCUIT STRUCTURE HAVING AN ELECTRICALLY CONDUCTIVE SURFACE FIXED BY COLLAR WALLS

BACKGROUND OF INVENTION

1. Field of Invention

The present invention relates to a conductive circuit structure in which circuit conductors such as bus bars which are used in the connection of a power supply circuit and the like of, for example, an automobile and are disposed in a resin substrate are exposed in the longitudinal direction.

2. Related Art

Conventionally, various conductive circuit structures have been proposed in which bus bars, i.e., narrow strip-shaped flat rectangular conductors, are insert-molded in an insulating synthetic resin. The bus bars are able to allow large currents to flow as compared with electric wires, and are mainly effective for power supply.

By way of an example of a conventional conductive circuit structure, FIGS. 5A and 5B illustrate a structure in which ends of bus bars are made to project from a resin material so as to be formed as portions of terminals (refer to the prior art in JP-A-11-77736).

Namely, two bus bars are arranged in parallel inside a rectangular flat resin substrate 41, and one terminal portion of each bus bar 42 projects from one end portion of the resin substrate 41 to the outside and is formed as a tag terminal 42a. The other end portion side of the resin substrate 41 continues integrally to a flange portion 43 for fixing and a housing 44 on the flange portion, and the other terminal portion (not shown) of each bus bar 42 is led into the interior of the housing 44.

The resin substrate 41 is cut away in a longitudinally intermediate portion of the resin substrate 41, and this portion 42a of each bus bar 42 is in a slightly exposed state. This is because, at the time of insert-molding the bus bars 42, the bus bars 42 are fixed by clamping the bus bars 42 by a molding metal mold (not shown). To prevent this exposure, a method is disclosed in JP-A-11-77736 in which the bus bars 42 are fixed by a holder (not shown), and resin pouring is effected in a state in which the holder is clamped by a mold.

In addition, JP-A-10-249882 discloses a conductive circuit structure in which bus bars are insert-molded in a resin material, and end portions of the bus bars are bent orthogonal and are exposed to the outside from an end portion of the resin material so as to be formed as terminal portions.

In addition, an arrangement in which the bus bars, instead of being insert-molded, are fitted in grooves in a resin substrate and are routed in a required configuration is applied to a bus bar wiring board (not shown) of an electrical connection box.

However, with the above-described conventional conductive circuit structure in which the bus bars are insert-molded, the bus bars 42 can be connected to circuits and electrical components on the mating side only at the end side of the resin substrate 41, so that there has been a problem in that the degree of freedom of circuit design is limited. In addition, there has been another problem in that the number of electrical components and auxiliary equipment that are connected is limited.

Particularly in circuits including those of an instrument panel of an automobile, a need for connection of optional parts and circuit changes as well as a need for add-on circuits (additional circuits) attributable to them are likely to occur. Therefore, in correspondence with these needs, there has been a strong demand for a conductive circuit structure which is capable of easily and reliably effecting connection with bus bar circuits for power supply and the like with a certain degree of freedom in the connecting position.

In addition, with the conductive circuit structure in which the bus bars are routed on the resin substrate without being insert-molded, there has been a problem in that the strength of fixation of the bus bars is weak and the bus bars cannot be fixed unless the resin substrates are laminated, and there has been an additional problem in that the insulation between the exposed bus bars is liable to deteriorate.

SUMMARY OF INVENTION

In view of the above-described aspects, an object of the invention is to provide a conductive circuit structure which is capable of allowing circuit conductors such as bus bars to be easily connected to the circuits and the like on the mating side even at portions other than the end portion of the resin substrate so as to improve the degree of freedom in circuit design and the like, which makes it possible to increase the number of electrical components and the like to be connected, which makes it possible to increase the strength of fixation of the circuit conductors and to improve the insulation between the circuit conductors.

To attain the above object, the invention basically provides a conductive circuit structure in which an electrically conductive circuit conductor is disposed on an insulating resin substrate, characterized in that an electrically conductive surface of the circuit conductor is exposed from the resin substrate continuously in a longitudinal direction, and both side portions of the conductive surface are covered and fixed by collar walls of the resin substrate.

It is also effective if a plurality of the circuit conductors are arranged in parallel, and the conductive surface of each of the circuit conductors is exposed from the resin substrate continuously in the longitudinal direction.

In addition, it is also effective if the circuit conductor is a bus bar.

In addition, it is also effective if the circuit conductor is insert-molded in the resin substrate.

In the present invention, it is also effective if the circuit conductor is an electrically conductive resin material.

It is also effective if the conductive resin material is poured and solidified in a groove portion having collar walls in the resin substrate.

In addition, it is also effective if a contact terminal on a mating circuit side or electrical component side is brought into contact with the conductive surface of the circuit conductor.

In addition, it is also effective if a second circuit board is laminated on the resin substrate, an insertion hole for allowing the conductive surface of the circuit conductor to be exposed is provided in the second circuit board, and the contact terminal is inserted in the insertion hole so as to be brought into contact with the conductive surface of the circuit conductor.

In addition, it is also effective if other contact terminals on the mating circuit side or electrical component side are brought into contact with circuits of the second circuit board.

BRIEF DESCRIPTION OF DRAWINGS

FIG. 1 is a perspective view illustrating a first embodiment of a conductive circuit structure in accordance with the invention (a circled portion is an enlarged view of an essential portion);

FIGS. 2(a) and 2(b) illustrates a second embodiment of the conductive circuit structure in accordance with the invention, in which FIG. 2(a) is a perspective view, and FIG. 2(b) is a front elevational view of an essential portion;

FIGS. 3(a) and 3(b) illustrates a third embodiment of the conductive circuit structure in accordance with the invention, in which FIG. 3A is a perspective view, and FIG. 3B is a front elevational view of an essential portion;

FIGS. 5(a) and 5(b) illustrates a form of a conventional conductive circuit structure, in which FIG. 5A is a side elevational view, and FIG. 5B is a front elevational view.

DETAILED DESCRIPTION OF PREFERRED EMBODIMENTS

Figure 2A:
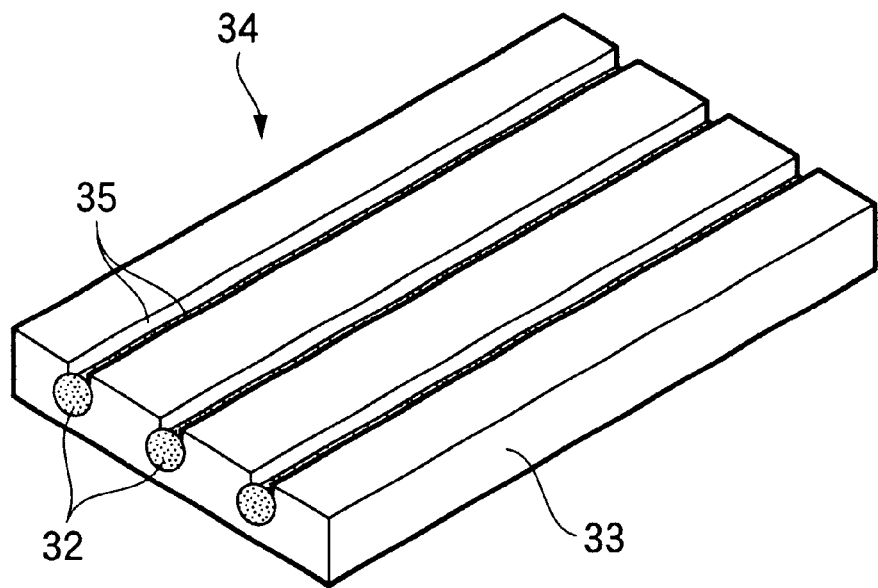

Referring now to the accompanying drawings, a detailed description will be given of the embodiments of the invention.

FIG. 1 illustrates a first embodiment of the conductive circuit structure in accordance with the invention.

This structure is characterized in that a plurality of bus bars 2 which are flat conductors are arranged in parallel and straightly on the obverse surface side of an insulating resin substrate 1 by insert molding, that flat electrically conductive surfaces 3 of the respective bus bars 2 are exposed to the outside over their entire lengths, and that both side portions 4 the conductive surface 3 of each bus bar 2 are firmly fixed by a pair of collar walls 5 formed integrally with the resin substrate 1.

The collar walls 5 project in parallel with the bus bar 2 in the widthwise direction of the bus bar 2, and is comprised of a lower portion 5a in close contact with the conductive surface 3 of the bus bar 2, an inner surface 5b rising orthogonally upward from the conductive surface 3 of the bus bar 2, and an upper portion Acrylonitrile-Butadiene Styrene Copolymer (ABS) or the like is preferable as the synthetic resin material of the resin substrate 1.

The respective collar walls 5 are located in such a way as to oppose each other at both side portions 4 of one bus bar 2, and a shallow groove 6 for allowing a terminal (not shown) of a connecting-side circuit to advance toward the conductive surface 3 of the bus bar 2 is formed between the two collar walls 5. The bus bar 2 is firmly fixed to the resin substrate 1 by the two collar walls 5, and the creeping distance between the adjacent bus bars is secured to enhance insulation. In addition, the groove 6 between the two collar walls also acts as a positioning portion for the terminal (not shown) of the connecting-side circuit.

It is preferred that the thickness T of the collar wall 5 be set to be slightly larger than the thickness of the bus bar 2 by taking into consideration the strength of fixation of the bus bar 2 and the connectability of the mating circuit (not shown). Both side portions and the reverse surface of the bus bar 2 are in close contact with the resin substrate 1, and the thickness of the resin substrate 1 on the reverse surface side of the bus bar 2 is set to be by far larger than the thickness of the bus bar 2 by taking insulation into consideration. By way of an example, the thickness of the bus bar is about 0.5 mm, the thickness of the collar wall 5 is about 1 mm, and the total thickness of the resin substrate 1 is about 3.5 mm.

In addition, the projecting length L of the collar wall is preferably about 1/5 of the width of the bus bar 2 by taking into consideration the strength for holding the bus bar 2 and the securing of the exposed surface (substituted by reference numeral 3) of the bus bar 2. By way of an example, the width of the bus bar 2 is about 5 mm, and the width of the exposed surface (3) of the bus bar 2 is about 3 mm (the projecting length of the conductive circuit structure is about 1 mm). It should be noted that even if the collar walls 5 rise on the obverse surface side of the resin substrate 1 in resin molding, no problem is encountered in the actual use.

The number of the bus bars 2 routed is not limited to three, and is set appropriately in correspondence with the number of circuits on the connecting side. The number of the bus bars 2 may be one. Further, the bus bars 2 may be arranged in two layers on both obverse and reverse surface sides of the resin substrate 1. The front ends and rear ends of the bus bars 2 may not be exposed at the longitudinal front and rear end portions of the resin substrate 1, and may be buried in the resin substrate 1 so as to provide insulation. In FIG. 1, the bus bars 2 and the resin substrate 1 constitute a bus bar circuit board 7.

At the time of the insert-molding of the bus bars 2, in a state in which the front end sides and the rear end sides of the bus bars 2 are gripped with chucks or the like (not shown), and the bus bars 2 are pulled in the longitudinal direction, the bus bars 2 are set in an unillustrated molding metal mold. Then, in a state in which the bus bars 2 are tensioned, a molten resin material is poured into the mold. Thus, the fixing means for the bus bars in the mold become unnecessary, and the long, thin, and flexible bus bars 2 are carefully insert-molded.

The exposed surfaces of the bus bars 2 are formed such that portions (e.g., protrusions) of the mold are held in close contact with the conductive surfaces 3 of the bus bars 2 in the longitudinal direction, and the resin material does not enter between the bus bars 2 and the protrusions (not shown). It goes without saying that insert molding may be effected in a state in which longitudinally intermediate portions of the bus bars 2 are fixed by pressing pins (not shown) which are portions of the mold. Finally, the chucked portions on both end sides are cut off, and the overall bus bars 2 are, for instance, cut to a required length, thereby obtaining the bus bar circuit board 7 shown in FIG. 1. The above-described arrangement is effective as a method of manufacturing the bus bar circuit board 7.

In FIG. 1, as the terminals (not shown) of the mating circuits come into contact with the exposed surfaces (3) of the bus bars 2, the bus bars 2 and the mating circuits are connected. Since the conductive surfaces 3 are exposed continuously in the longitudinal direction of the bus bars 2, the terminals of the mating circuits, such as a wire harness and a circuit board, and the terminals of electrical components, auxiliary equipment, and the like can be brought into contact at any longitudinal positions of the bus bars 2. As a result, the degree of freedom of the positions of the mating circuits, electrical components, and the like increases, so that the degree of freedom in the circuit design can be enhanced.

It should be noted that the terminals (not shown) of the mating circuits, electrical components, and the like, instead of being connected by contact, may be firmly connected to the bus bars 2 by beam welding or other similar means. In addition, pressing portions for reinforcement (not shown) which are in close contact with the conductive surfaces 3 in the longitudinally intermediate portions of the bus bars 2 may be formed integrally with the resin substrate 1.

Figure 2B:
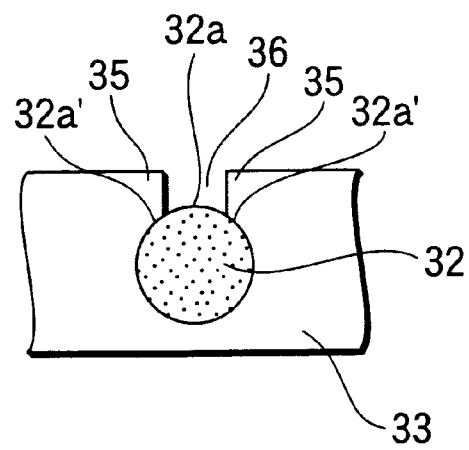

FIGS. 2A and 2B illustrate a second embodiment of the conductive circuit structure in accordance with the invention.

In this structure, conductors 32 with round cross sections are used as the circuit conductors instead of the above-described bus bars. As the round conductors 32, solid wires (bare wires) are used. the round conductors 32 are insert-molded on an insulating resin substrate 33 by a method similar to that of the first embodiment, thereby forming a circuit board 34. Both side portions 32a' of a conductive surface 32a of each round conductor 32 are pressed by a pair of collar walls 35 of the resin substrate 33, and each round conductor 32 is firmly fixed by the collar walls 35 on both sides. The round conductors 32 are arranged in parallel at equal pitches.

A portion of the conductive surface 32a which is an outer surface of the round conductor 32 is exposed between the conductive circuit structures 35 on both sides. The conductive surface 32a is curved in an outwardly arcuate shape, and an apex of the conductive surface 32a is located intermediately between the two conductive circuit structures 35. By causing the contact terminal (not shown) on the mating side to advance into a groove 36 formed by both collar walls 35, the contact terminal is reliably brought into contact the apex portion of the conductive surface 32a in the form of line contact or point contact.

Since the conductive surface 32a is exposed over the entire length of each round conductor 32, the contact terminal of the mating side can be connected at any longitudinal position of the round conductor 32. In addition, since the round conductor 32 is firmly held by the collar walls 35 on both sides, the possibility of the round conductor 32 from becoming dislocated from the resin substrate 33 due to a vibration or the like is nil. Further, since the creeping distance between the round conductors 32 is sufficiently secured by the conductive circuit structures 35, insulation is also favorable.

Figure 3A:
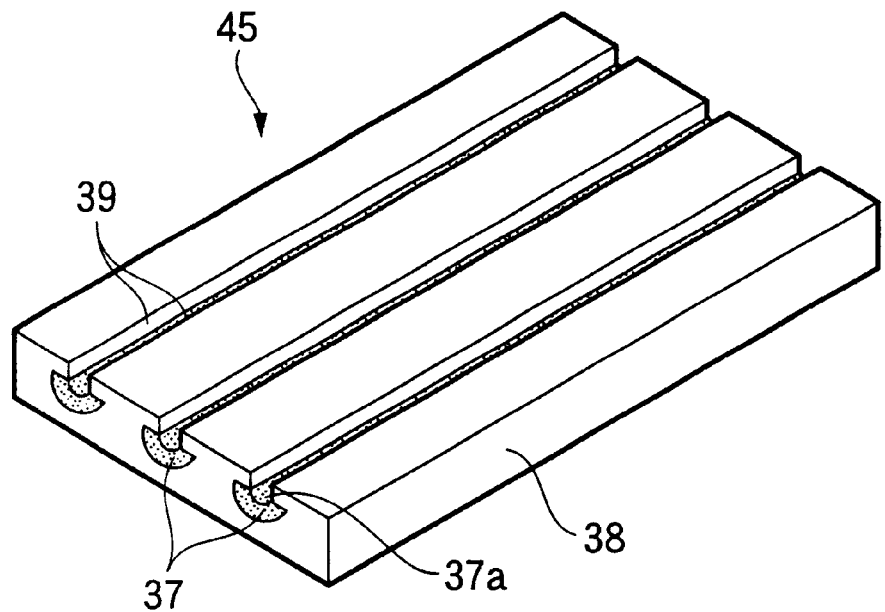
Figure 3B:
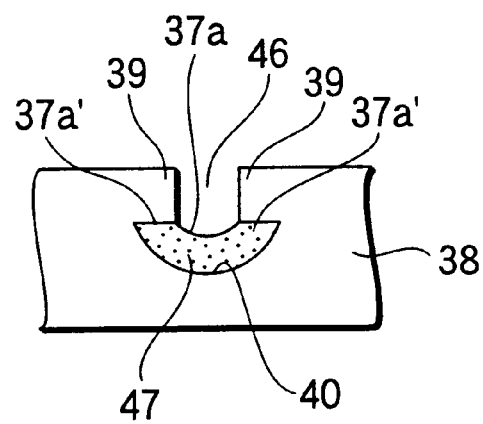

FIGS. 3A and 3B illustrate a third embodiment of the conductive circuit structure in accordance with the invention.

In this structure, an electrically conductive resin material 37 is used as the circuit conductor, and the conductive resin material 37 in a molten state is poured into each groove portion 40 with collar walls 39 of an insulating resin substrate 38, and is allowed to solidify (cure).

The conductive resin material 37 contains therein electrically conductive material such as copper powder or carbon, and is injected into the groove portions 40 in the resin substrate 38 by injection molding or other similar means. A circuit board 45 can be easily formed by so-called two-color molding. The conductive resin material 37 together with the resin substrate 38 can be formed of a soft material such as synthetic rubber or the like, in which case the circuit board 45 itself is flexible and is deformable in a three-dimensional shape, thereby making it possible to cope with an attaching portion of a complicated shape.

The groove portions 40 in the resin substrate 38 are formed substantially arcuately, and are formed in parallel straightly in the longitudinal direction of the resin substrate 38 and at equal pitches. The collar walls 39 each having a rectangular cross section are respectively formed on both sides of the upper portion of the groove portion 40, and a narrow groove 46 continuing to the groove portion 40 is formed between the two conductive circuit structures 39. The groove portions 40 can be easily formed, for instance, by pulling out rod-like molding tools (not shown) having arcuate cross sections in the longitudinal direction of the resin substrate 38. The molten resin material (37) is reliably filled in the groove portions 40 having arcuate cross sections without gaps.

Conductive surfaces 37a of the conductive resin material (circuit conductors) 37 are exposed between the respective two collar walls 39. By causing the contact terminals (not shown) on the mating side to advance into the grooves 46, the contact terminals are brought into contact with the conductive surfaces 37a of the conductive resin material 37. Depending on the shape of the contact terminals, the conductive surfaces 37a may be slightly convex or may be formed flatly. The contact terminals are connectable at any positions in the overall length of the conductive resin material 37. Since the conductive resin material 37 is formed integrally with the resin substrate 38 by resin molding and is firmly secured thereto, there is no possibility of becoming dislocated. However, since both side portions 37a' of the conductive surfaces 37a are pressed by the conductive circuit structures 39 on both sides, the fixing strength is further enhanced.

Figure 4:
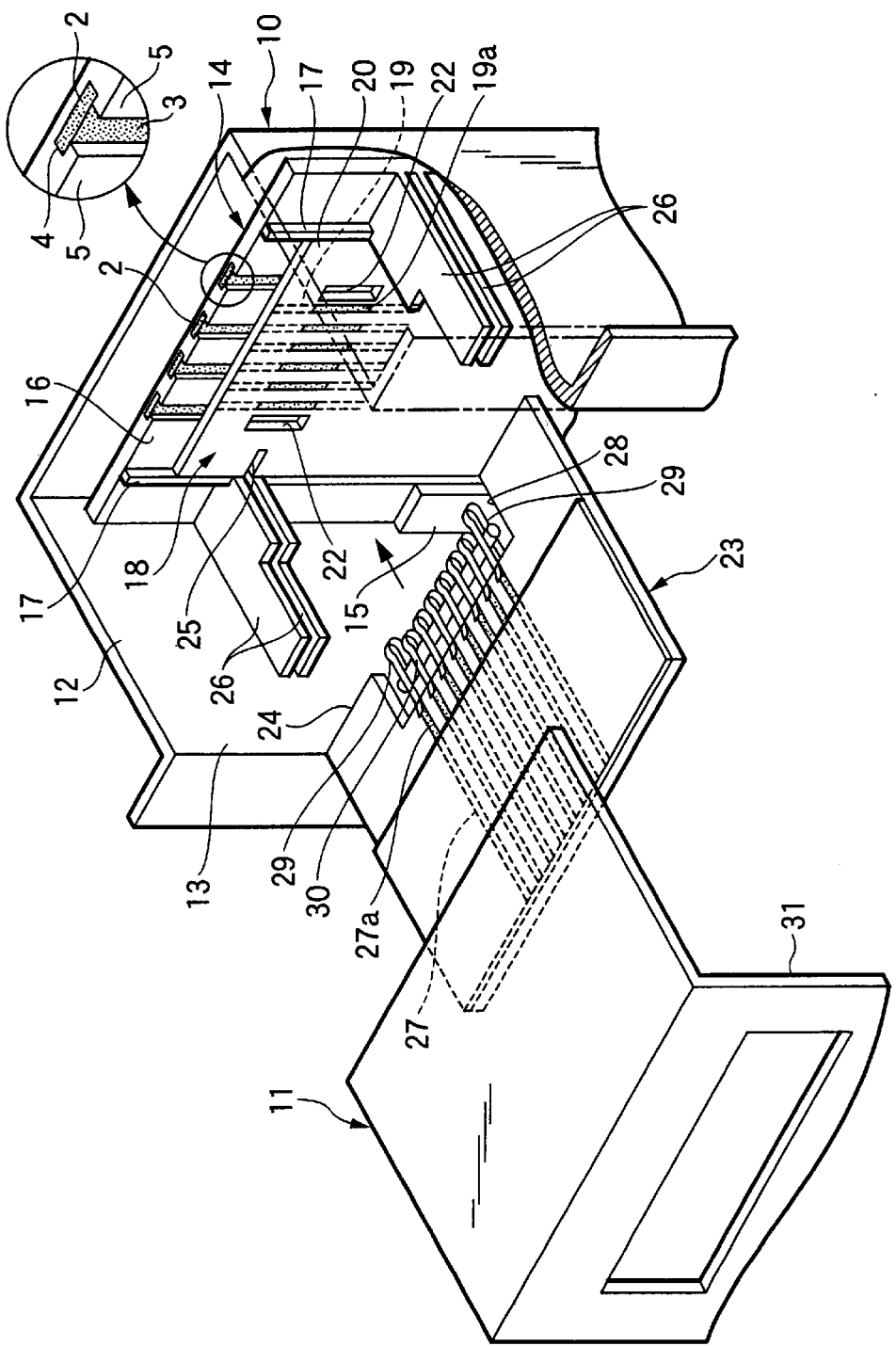
FIG. 4 is an exploded perspective view illustrating an example of application of the conductive circuit structure.
Figure 5A:
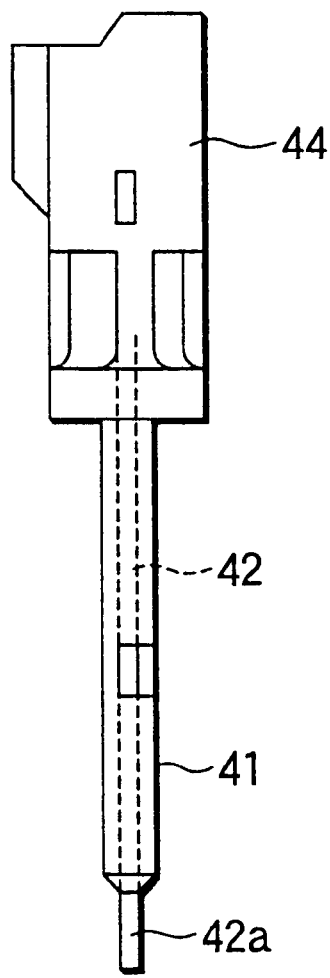
Figure 5B:
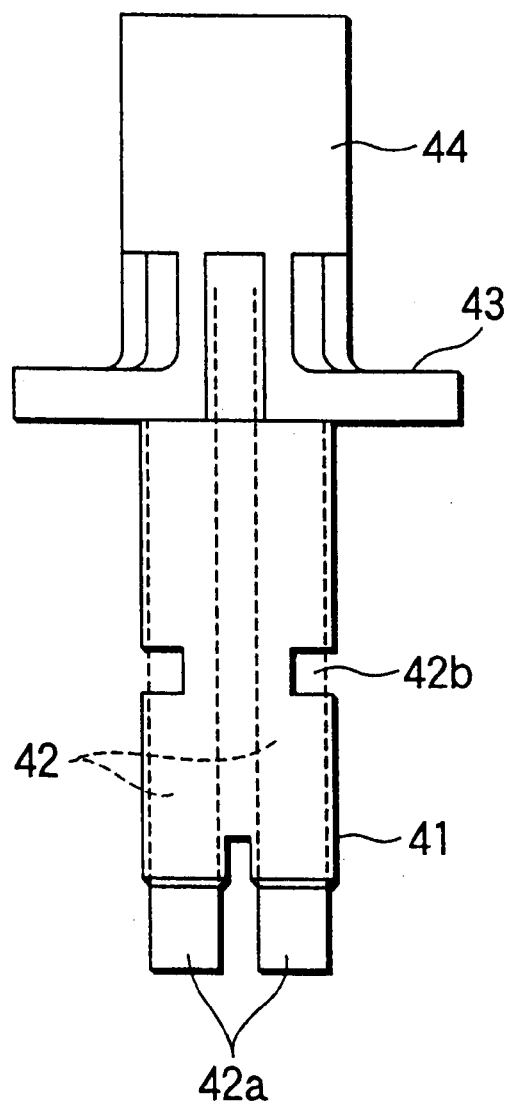

FIG. 4 illustrates an example in which the conductive circuit structure in accordance with one of the above-described embodiments is applied to the circuit of a center cluster of an automobile. Component parts identical to those shown in FIG. 1 will be denoted by the same reference numerals, and a detailed description thereof will be omitted.

In FIG. 4, reference numeral 10 denotes a synthetic resin-made case with its upper and front portions open, and reference numeral 11 denotes a synthetic resin-made cluster cover for covering openings 12 and 13 of the case 10. A bus bar circuit board 14 for power supply having the above-described bus bar circuit structure is vertically inserted and fitted in the case 10 through the upper opening 12. The bus bar circuit board 14 is fixed in the case 10 as both side portions of a resin substrate 16 are inserted between a pair of left and right guide plates 15 disposed on a rear wall of the case 10.

The plurality of bus bars 2 have been insert-molded on the central side of the bus bar circuit board 14, and the conductive surfaces 3 of the bus bars 2 are exposed including those portions of the bus bars 2 which are covered with the pair of left and right collar walls 5 in the same way as in the above-described embodiments. The exposed surfaces of the bus bars 2 are oriented toward the front opening 13 side of the case 10. The bus bars 2 are arranged in parallel at equal pitches.

A pair of protrusions 17 are disposed in parallel on the surface of the resin substrate 16 adjacent to the left- and right-end-side bus bars 2, respectively, and a second circuit board 18 for, for example, signal lines is fitted between the pair of protrusions 17. Thus, a two-layered circuit board is formed by the bus bar circuit board 14 and the second circuit board 18.

A pattern of a plurality of printed circuits (circuits) 19 for, for example, signal lines is formed on the surface of the second circuit board 18, an insulating film 20 is coated on the printed circuits, and connecting portions 19a of the respective printed circuits 19 are exposed in parallel from window portions of the insulating film 20. In addition, rectangular terminal inserting holes (insertion holes) 22 are provided in the second circuit board 18 adjacent to the connecting portions 19a on the left- and right-end sides, and exposed surfaces (3) of the predetermined bus bars 2 are located in the terminal inserting holes 22 in an opposing manner.

Slit-like board inserting holes 25 for inserting distal end portions 24 of a third circuit board 23 for, for example, auxiliary equipment connection are provided in the second circuit board 18 and the bus bar circuit board 14 adjacent to the terminal inserting holes 22, and a pair of guide plates 26 project orthogonally from the surfaces of both side portions of the bus bar circuit board 14 adjacent to the board inserting holes 25. The third circuit board 23 is inserted between the pair of guide plates 26. The second circuit board 18 and the third circuit board 23 are located perpendicularly to each other.

A pattern of a plurality of printed circuits (mating circuits) 27 are formed on the third circuit board 23, and contact terminals 29 and 30 are connected to exposed end portions 27a of the printed circuits 27 in a recessed portion 28 on a distal end side of the third circuit board 23. As for the arrangement of the contact terminals 29 and 30, a proposal will be made in a patent application to be filed separately. In this embodiment, each contact terminal 29 has at one end an electrical contact portion for the exposed end portion 27a, and at the other end an electrical contact portion for the exposed surface (3) of the bus bar 2. Meanwhile, each contact terminal 30 has at one end an electrical contact portion for the exposed end portion 27a, and at the other end an electrical contact portion for the connecting portion 19a of the second circuit board 18. The contact terminals 29 for bus bar connection project longer than the other contact terminals 30.

By inserting the both-side distal end portions 24 of the third circuit board 23 between the guide plates 26 from the horizontal direction, the electrical contact portions of the contact terminals 30 within the recessed portion 28 are brought into contact with the connecting portions 19a of the printed circuits 19 of the second circuit board 18, and the electrical contact portions of the contact terminals 29 are passed through the terminal inserting holes 22 and are brought into contact with the exposed surfaces (3) of the bus bars 2 of the bus bar circuit board 14.

Consequently, the bus bar circuit board 14 and the second and third circuit boards 14 and 23 are interconnected, power is supplied from the bus bar circuit board 14 to the third circuit board 23 on the auxiliary equipment side, for instance, and the third circuit board 23 and the second circuit board 14 are interconnected, thereby effecting control of the auxiliary equipment. As the cluster cover 11 is closed on the case 10, the third circuit board 23 is, for instance, pressed by an inner wall surface 31 of the cluster cover 11, and the state of connection of the circuit boards 14, 18, and 23 is maintained.

In the above-described example of application, a fourth circuit board (not shown) may be disposed in parallel on the lower side of the third circuit board 23, and two contact terminals (not shown) of the fourth circuit board and two centrally-oriented bus bars 2 of the bus bar circuit board 14 may be connected in the same way as the third circuit board 23. By adopting this arrangement the number of electrical components and auxiliary equipment connected can be increased.

The positions where the third (23) and fourth circuit boards are connected to the bus bar circuit board 14 may be at any positions in the longitudinal direction of the bus bar circuit board 14, and is suffices if the second circuit board 18 is provided with the terminal inserting holes 22 at those positions. Consequently, the bus bars 2 can be connected to circuits and the like on the auxiliary equipment side at desired positions within the case 10.

In addition, instead of the third circuit board 23, contact terminals of connectors of an unillustrated wire harness (a collection of a plurality of wires) may be connected to the second circuit board 18 and the bus bar circuit board 14. At this juncture, the contact terminals (not shown) of the connectors can be slid on the exposed surfaces (3) of the bus bars 2, with the result that the degree of freedom of the contact position is enhanced, and the oxide films on the surfaces are removed to improve the reliability of electrical connection. In addition, the horizontal guide plates 26 may be provided on the case 10, and the board inserting holes 25 may be omitted depending on the shape of the distal end portions 24 of the third circuit board 23. Further, flat conductors or the like may be used instead of the printed circuits 19 and 27.

As described above, in accordance with the invention according to claim 1, since the conductive surface of the circuit conductor is exposed from the resin substrate continuously in the longitudinal direction, the mating circuit, electrical component, auxiliary equipment, or the like can be connected at a longitudinally desired position of the circuit conductor. As a result, the degree of freedom in the layout of the mating circuit, electrical component, auxiliary equipment, or the like is enhanced, so that the circuit design or the design of an automobile is facilitated, and the number of electrical components and auxiliary equipment connected increases. In addition, in a case where circuit conductors for power supply must be disposed on an add-on or additional basis, it becomes possible to easily cope with the situation by using the conductive circuit structure in accordance with the invention.

In addition, since both side portions of the conductive surface are held by being covered by collar walls of the resin substrate, the lifting off or dislocation of the circuit conductor from the resin substrate can be reliably prevented, so that it is possible to reliably prevent the interference, faulty contact or the like with the mating circuit due to the lifting off of the circuit conductor. Further, the creeping distance between the adjacent circuit conductors increases by virtue of the insulating collar walls, and insulation can be enhanced. Additionally, since the circuit conductor is exposed flush with the surface of the resin substrate and is located in a slightly recessed manner, unintentional contact or interference with the outside can be prevented. Furthermore, it is possible to position the contact terminal and the like of the mating circuit between the collar walls on both sides, so that the connection between the circuit conductor and the mating circuit and the like can be effected reliably.

Further, in accordance with the present invention, the number of circuits connected increases by the plurality of circuit conductors, and the form of connection of circuits can be diversified.

Further, in accordance with the present invention, since a bus bar having higher rigidity than an electric wire is used, the bus bar can be fixed by the collar walls more firmly than the wire, and the dislocation or loosening of the bus bar due to the vibration of the vehicle or the like can be reliably prevented. In addition, conduction of a high current is made possible by the bus bar, so that the conductive circuit structure can be applied to a power supply circuit.

Further, in accordance with the present invention, since the circuit conductor is insert-molded onto the resin substrate, the operation of fixing the circuit conductor to the resin substrate becomes unnecessary, so that the fabrication of the circuit board can be facilitated.

Further, in accordance with the present invention, since the circuit board can be made lightweight by the electrically conductive resin material.

Further, in accordance with the present invention, by pouring the conductive resin material into the groove portion in the resin substrate, the formation of the circuit board can be facilitated, and the conductive resin material is secured to the resin substrate and is firmly fixed thereto. In addition, as the conductive resin material together with the resin substrate is formed of a soft resin material such as synthetic rubber, the circuit board becomes flexible, and it is possible to cope with an attaching portion of a complicated shape.

Further, in accordance with the present invention, by causing the contact terminal on the mating circuit side or electrical component side to be brought into contact with the conductive surface of the circuit conductor, it is possible to reliably connect the circuit conductor to the mating circuit, electrical component, and the like in a longitudinally desired position of the circuit conductor.

Further, in accordance with the present invention, since a second circuit board is laminated on the resin substrate, power supply lines and signal lines, for instance, can be arranged by types of layer, so that the forms of circuits can be readily diversified. In addition, by causing the contact terminal of the mating circuit, electrical components, and the like to be brought into contact with the conductive surface of the circuit conductor through the insertion hole in the second circuit board, the circuit conductor and the mating circuit, electrical component, and the like can be easily and reliably connected, thereby diversifying the forms of circuit connection.

Further, in accordance with the present invention, since other contact terminals on the mating circuit side or electrical component side are brought into contact with circuits of the second circuit board, the second circuit board and the mating circuit, electrical component, and the like are connected, thereby further diversifying the forms of circuit connection.

What is claimed is:

1. A conductive circuit structure comprising:
an electrically conductive circuit conductor being disposed on an insulating resin substrate, an electrically conductive surface of said circuit conductor being exposed from said resin substrate continuously in a longitudinal direction, and both side portions of said conductive surface being covered and fixed by collar walls of said resin substrate such that the exposed electrically conductive surface is recessed within the collar walls of said resin substrate.

2. The conductive circuit structure according to claim 1, wherein a plurality of said circuit conductors are arranged in parallel, and the conductive surface of each of said circuit conductors is exposed from said resin substrate continuously in the longitudinal direction.

3. The conductive circuit structure according to claim 1, wherein said circuit conductor is a bus bar.

4. The conductive circuit structure according to claim 2, wherein said circuit conductor is a bus bar.

5. The conductive circuit structure according to claim 1, wherein said circuit conductor is insert-molded in said resin substrate.

6. The conductive circuit structure according to claim 2, wherein said circuit conductor is insert-molded in said resin substrate.

7. The conductive circuit structure according to claim 3, wherein said circuit conductor is insert-molded in said resin substrate.

8. The conductive circuit structure according to claim 1, wherein said circuit conductor is an electrically conductive resin material.

9. The conductive circuit structure according to claim 2, wherein said circuit conductor is an electrically conductive resin material.

10. The conductive circuit structure according to claim 8, wherein said conductive resin material is poured and solidified in a groove portion having collar walls in said resin substrate.

11. The conductive circuit structure according to claim 9, wherein said conductive resin material is poured and solidified in a groove portion having collar walls in said resin substrate.

12. A conductive circuit structure comprising:
an electrically conductive circuit conductor being disposed on an insulating resin substrate, an electrically conductive surface of said circuit conductor being exposed from said resin substrate continuously in a longitudinal direction, and both side portions of said conductive surface being covered and fixed by collar walls of said resin substrate,
wherein the conductive surface of said circuit conductor is brought into contact with at least one of a contact terminal on a mating circuit side and electrical component side.

13. The conductive circuit structure according to claim 12, further comprising:
a second circuit board laminated on said resin substrate; and
an insertion hole, for allowing the conductive surface of said circuit conductor to be exposed, provided in said second circuit board,
wherein said contact terminal is inserted in said insertion hole so as to be brought into contact with the conductive surface of said circuit conductor.

14. The conductive circuit structure according to claim 13, wherein circuits of said second circuit board are brought into contact with other contact at least one of terminals on said mating circuit side and electrical component side.

15. The conductive circuit structure according to claim 12, wherein a plurality of said circuit conductors are arranged in parallel, and the conductive surface of each of said circuit conductors is exposed from said resin substrate continuously in the longitudinal direction.

16. The conductive circuit structure according to claim 12, wherein said circuit conductor is a bus bar.

17. The conductive circuit structure according to claim 15, wherein said circuit conductor is a bus bar.

18. The conductive circuit structure according to claim 12, wherein said circuit conductor is insert-molded in said resin substrate.

19. The conductive circuit structure according to claim 15, wherein said circuit conductor is insert-molded in said resin substrate.

20. The conductive circuit structure according to claim 16, wherein said circuit conductor is insert-molded in said resin substrate.

21. The conductive circuit structure according to claim 12, wherein said circuit conductor is an electrically conductive resin material.

22. The conductive circuit structure according to claim 15, wherein said circuit conductor is an electrically conductive resin material.

23. The conductive circuit structure according to claim 21, wherein said conductive resin material is poured and solidified in a groove portion having collar walls in said resin substrate.

24. The conductive circuit structure according to claim 22, wherein said conductive resin material is poured and solidified in a groove portion having collar walls in said resin substrate.

* * * * *